US012066324B2

(12) United States Patent
Vaiana et al.

(10) Patent No.: US 12,066,324 B2
(45) Date of Patent: Aug. 20, 2024

(54) RADIATION SENSOR WITH AN INTEGRATED MECHANICAL OPTICAL MODULATOR AND RELATED MANUFACTURING PROCESS

(71) Applicant: STMICROELECTRONICS S.R.L., Agrate Brianza (IT)

(72) Inventors: Michele Vaiana, San Giovanni la Punta (IT); Enri Duqi, Milan (IT); Maria Eloisa Castagna, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 256 days.

(21) Appl. No.: 17/530,785

(22) Filed: Nov. 19, 2021

(65) Prior Publication Data

US 2022/0163383 A1 May 26, 2022

(30) Foreign Application Priority Data

Nov. 20, 2020 (IT) .......................... 102020000027912

(51) Int. Cl.
*G01J 1/36* (2006.01)
*H01L 33/46* (2010.01)
(52) U.S. Cl.
CPC .............. *G01J 1/36* (2013.01); *H01L 33/465* (2013.01); *G01J 2001/363* (2013.01)
(58) Field of Classification Search
CPC ........ G01J 1/36; G01J 2001/363; G01J 3/027; G01J 3/1804; G01J 3/2803; G01J 3/0232; G01J 5/02; H01L 33/465; G02B 26/04
See application file for complete search history.

(56) References Cited

U.S. PATENT DOCUMENTS

2004/0238600 A1* 12/2004 Tarn ................... G02B 26/0841
228/124.6
2006/0237751 A1* 10/2006 Morimoto ......... H01L 27/14623
348/E5.04

(Continued)

FOREIGN PATENT DOCUMENTS

WO    WO-2007115357 A1 * 10/2007 ................ G01J 3/02
WO    WO 2007115357 A1    10/2007

OTHER PUBLICATIONS

Huang et al., "Miniaturized NIR Spectrometer Based on Novel MOEMS Scanning Tilted Grating," *Micromachines*, 9(478), Sep. 20, 2018, 9 pages.

(Continued)

*Primary Examiner* — David P Porta
*Assistant Examiner* — Casey Bryant
(74) *Attorney, Agent, or Firm* — Seed IP Law Group LLP

(57) ABSTRACT

Radiation sensor including a detection assembly and a chopper assembly, which are mechanically coupled to delimit a main cavity; and wherein the chopper assembly includes: a suspended movable structure, which extends in the main cavity; and an actuation structure, which is electrically controllable to cause a change of position of the suspended movable structure. The detection unit includes a detection structure, which faces the main cavity and includes a number of detection devices. The suspended movable structure includes a first shield of conductive material, which shields the detection devices from the radiation, the shielding of the detection devices being a function of the position of the suspended movable structure.

20 Claims, 13 Drawing Sheets

(56) References Cited

U.S. PATENT DOCUMENTS

| | | | | |
|---|---|---|---|---|
| 2009/0244678 | A1* | 10/2009 | Hagood, IV | G02B 7/1821 |
| | | | | 359/290 |
| 2016/0140693 | A1* | 5/2016 | Sparks | G01J 3/027 |
| | | | | 345/618 |
| 2017/0289524 | A1* | 10/2017 | Pacala | G02B 5/208 |

OTHER PUBLICATIONS

Muttikulangara et al., "MEMS Tunable Diffraction Grating for Spaceborne Imaging Spectroscopic Applications," *Sensors*, 17(10), Oct. 17, 2017, 13 pages.

* cited by examiner

RADIATION SENSOR WITH AN INTEGRATED MECHANICAL OPTICAL MODULATOR AND RELATED MANUFACTURING PROCESS

BACKGROUND

Technical Field

The present disclosure relates to a radiation sensor with an integrated mechanical optical modulator, as well as to a corresponding manufacturing process.

Description of the Related Art

As is known, numerous radiation (for example, infrared radiation) sensors are currently available, some of which are characterized by systems of the type shown in FIG. 1. In detail, FIG. 1 shows a sensor 1 and a characterization system 2, which includes: an optical source 4 which simulates a black body and emits radiation; an optical modulator 6 of mechanical type (i.e., a shutter), which is also known as a chopper 6 and is configured to receive the radiation emitted by the optical source 4 and to transmit a test radiation; an optical circuit 8, configured to receive the test radiation and to direct it to the sensor 1, so that the latter generates a corresponding electrical signal; and an amplification and control circuitry 10, which receives the electrical signal and amplifies it, generating a corresponding output signal which may be used for the characterization, and further controls the chopper 6, to ensure the correct timing of the chopper 6. Typically, the amplification and control circuitry 10 comprises a so-called lock-in amplifier.

In practice, the chopper 6, of mechanical type, allows the intensity of the test radiation to be modulated, in such a way that the electrical signal generated by the sensor 1 is in translated band; in this manner, the output signal generated by the amplification and control circuitry 10 benefits from a greater resilience with respect to, for example, the optical noise.

Unfortunately, the need to have choppers means that the current characterization systems 2 are particularly bulky.

BRIEF SUMMARY

Embodiments are directed to a radiation sensor, a device comprising a radiation sensor, and manufacturing processes for forming same.

BRIEF DESCRIPTION OF THE SEVERAL VIEWS OF THE DRAWINGS

For a better understanding of the present invention, preferred embodiments thereof will now be described, purely by way of non-limiting example, with reference to the attached drawings, wherein.

DETAILED DESCRIPTION

Figure 1:
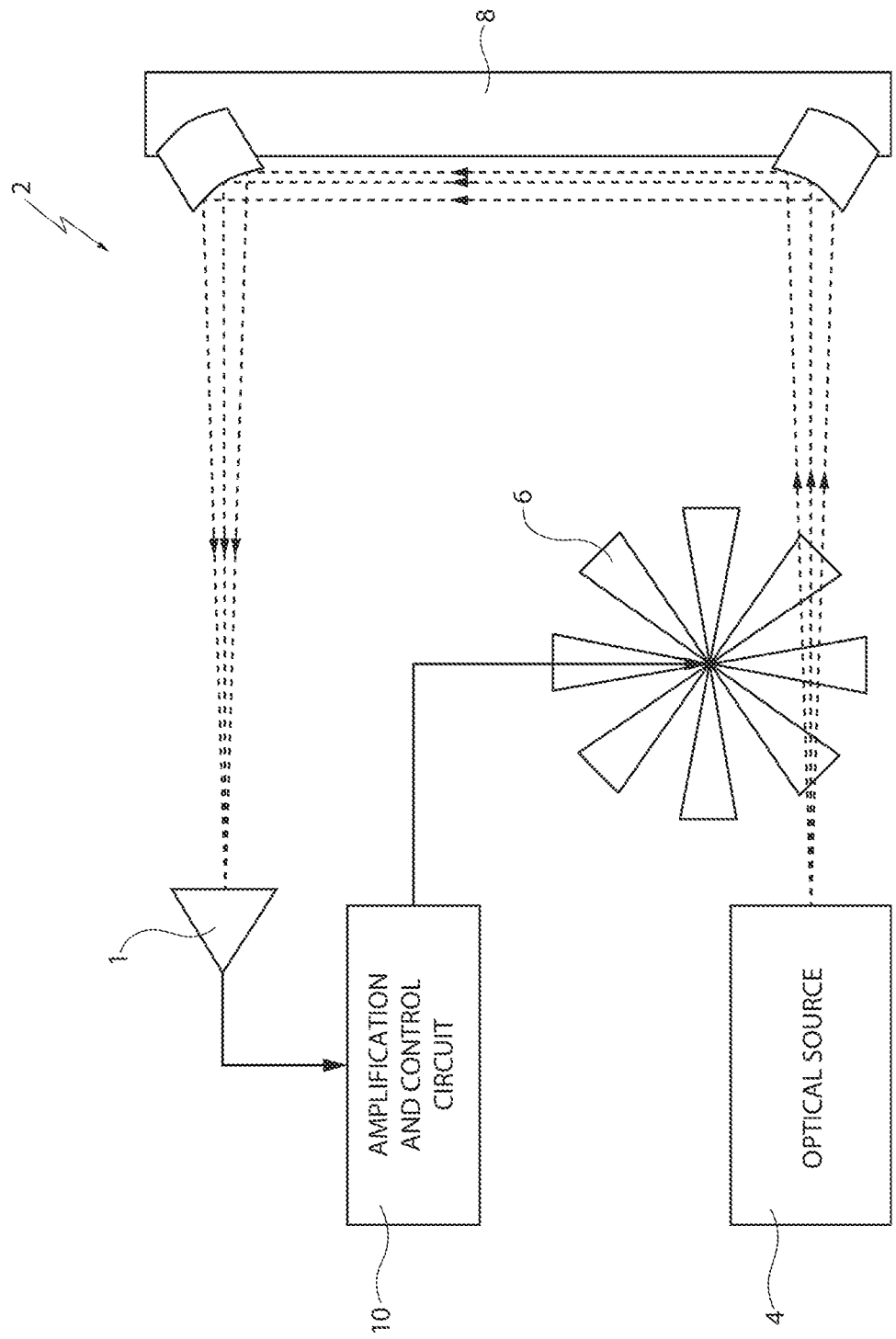
FIG. 1 shows a block diagram of a characterization system of known type.
Figure 2:
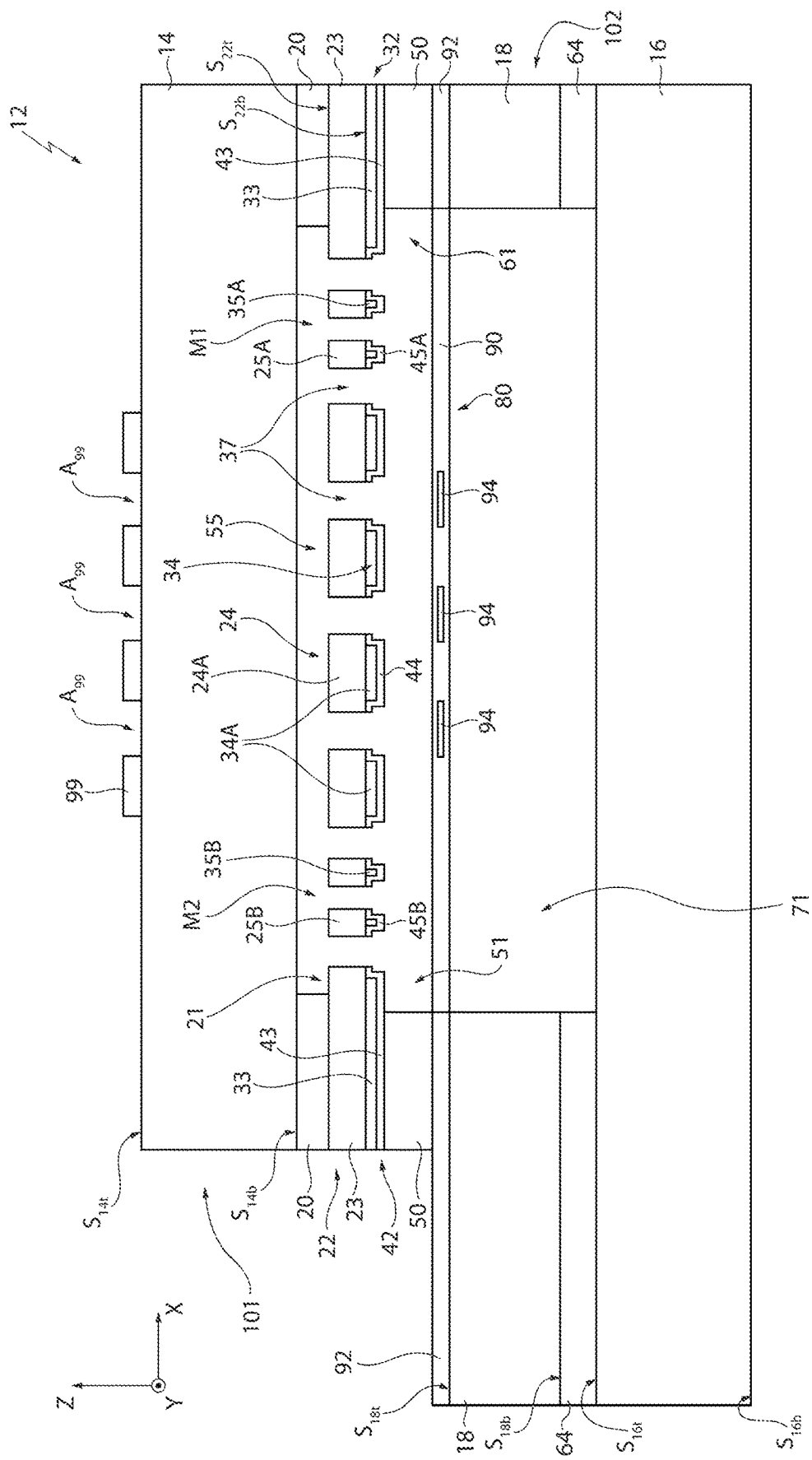
FIGS. 2 and 4 schematically show a cross-section of a radiation sensor, in two different operating conditions.

FIG. 2 shows a sensor 12, which comprises a first outer body 14, a second outer body 16 and an intermediate body 18.

The first outer body 14 is formed, for example, by a semiconductor material (e.g., silicon) and is delimited at the top and at the bottom by a top surface $S_{14t}$ and a bottom surface $S_{14b}$, respectively. The top and bottom surfaces, and other orientation terms used herein, are being used to refer to the orientation of the outer body 14 (or the sensor and device) as presented in the drawing. Similarly, the second outer body 16 is formed, for example, by a semiconductor material (e.g., silicon) and is delimited at the top and at the bottom by a respective top surface $S_{16t}$ and by a respective bottom surface $S_{16b}$. Furthermore, the intermediate body 18 is formed, for example, by a semiconductor material (e.g., silicon) and is delimited at the top and at the bottom by a respective top surface $S_{18t}$ and by a respective bottom surface $S_{18b}$.

The sensor 12 further comprises a dielectric region 20, which is formed for example by TEOS (Tetraethyl orthosilicate) oxide and extends below the first outer body 14, in direct contact with the bottom surface $S_{14b}$. The dielectric region 20 laterally delimits a cavity 21, which is delimited at the top by the first outer body 14, and hereinafter referred to as the first actuation half-cavity 21.

The sensor 12 further comprises an intermediate region 22, which is formed for example by polysilicon and extends below the dielectric region 20, being in direct contact therewith. In greater detail, the intermediate region 22 comprises: a peripheral portion 23, which extends in direct contact with the overlying dielectric region 20; an inner portion which forms a corresponding suspended region 24; and a first and a second intermediate portion 25A, 25B, which are arranged in a symmetrical manner with respect to the suspended region 24, in such a way that each of the first and the second intermediate portions 25A, 25B is interposed between a respective end of the suspended region 24 and the peripheral portion 23.

In practice, the suspended region 24 extends below the first actuation half-cavity 21 and is surrounded by the peripheral portion 23, being fixed thereto through the first and the second intermediate portions 25A, 25B, which form a first and a second spring M1, M2, respectively.

In greater detail, the intermediate region 22 is delimited at the top by a respective top surface $S_{22t}$, which contacts the dielectric region 20, and is delimited at the bottom by a respective bottom surface $S_{22}b$.

The sensor 12 further comprises an inner metal region 32, which is formed for example by aluminum, and extends below the intermediate region 22, being in direct contact therewith. In greater detail, the inner metal region 32 comprises: a respective peripheral portion 33, which extends in direct contact with the overlying peripheral portion 23 of the intermediate region 22; a respective inner portion, which forms a corresponding main shield 34; a respective first intermediate portion 35A and a respective second intermediate portion 35B, which are arranged in a symmetrical manner with respect to the main shield 34, in such a way that each of the first and the second intermediate portions 35A, 35B is interposed between a respective end of the main shield 34 and the peripheral portion 33.

In practice, the main shield 34 extends below the suspended region 24, being in direct contact therewith, and is fixed laterally to the peripheral portion 33 of the inner metal region 32 through the first and the second intermediate portions 35A, 35B of the inner metal region 32.

Figure 3:
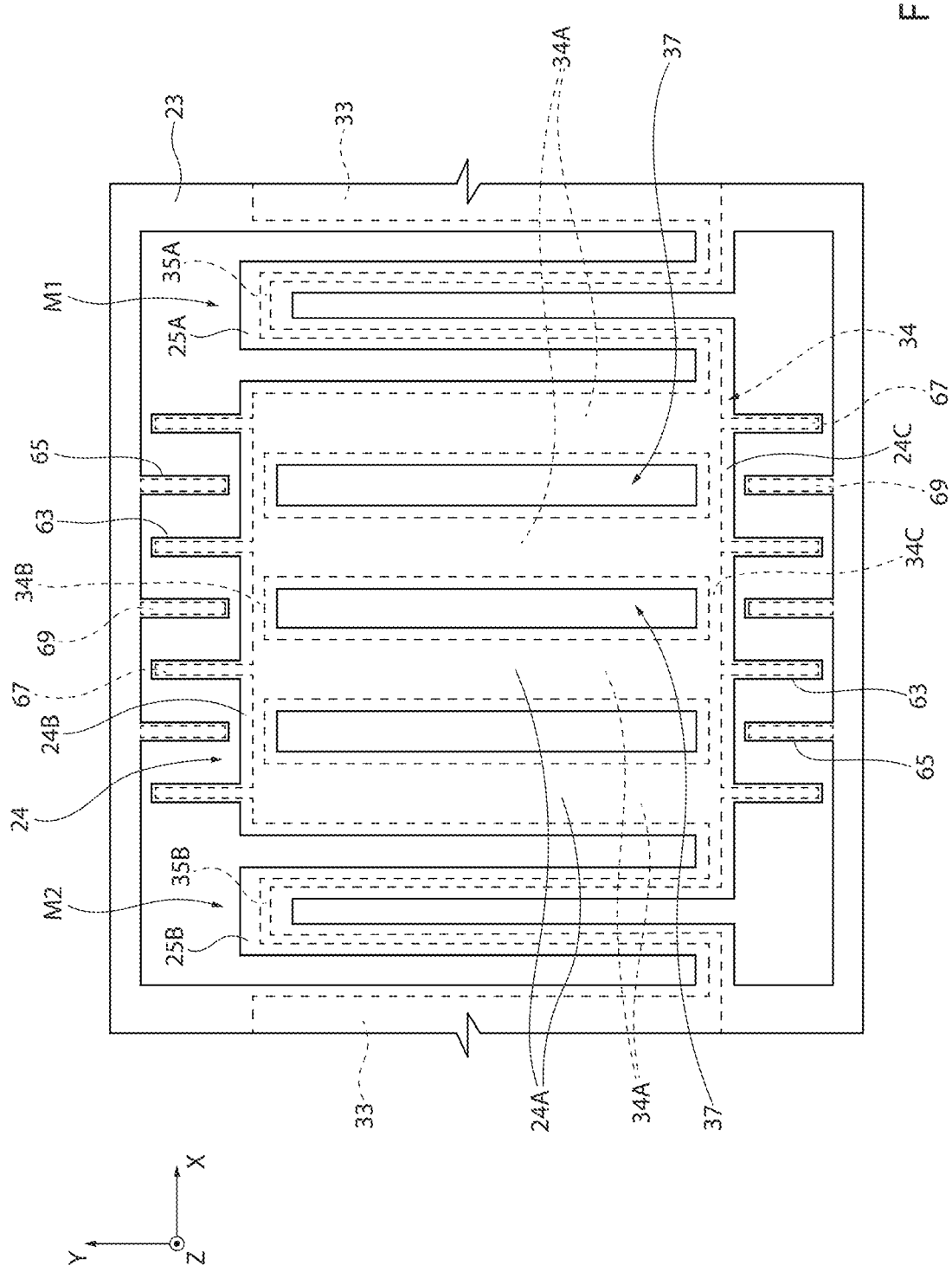
FIG. 3 schematically shows a top view of a portion of the sensor shown in FIG. 2.

As shown also in FIG. 3, the main shield 34 has a grating shape, which is holed.

In greater detail, the main shield 34 has a planar shape and comprises a plurality of bars 34A, which, without any loss of generality, are elongated along a Y-direction and are arranged in succession along an X-direction, perpendicular with respect to the Y-direction. Furthermore, the main shield 34 comprises first and second elongated portions 34B, 34C, which extend in parallel with the X-axis, are offset along the Y-axis, and are arranged so that each bar 34A has a first end fixed to the first elongated portion 34B and a second end fixed to the second elongated portion 34C.

The suspended region 24 entirely covers the main shield 34 and is traversed by a plurality of holes 37, which face at the top the first actuation half-cavity 21. In particular, the suspended region 24 comprises first and second elongated portions 24B, 24C, which extend in parallel with the X-axis, and a plurality of bar portions 24A. The first and the second elongated portions 24B, 24C of the suspended region 24 extend above the first and the second elongated portions 34B, 34C of the main shield 34, respectively, while each bar portion 24A of the suspended region 24 extends above a corresponding bar 34A of the main shield 34. Each bar 34A leaves exposed part of the portion of the bottom surface $S_{22b}$ delimited by the overlying bar portion 24A; similarly, the first and the second intermediate portions 35A, 35B of the inner metal region 32 leave exposed parts of the portions of bottom surface $S_{22b}$ delimited by the first and the second intermediate portions 25A, 25B of the intermediate region 22, respectively.

The sensor 12 further comprises a passivation region 42, which is formed for example by silicon nitride and comprises: a respective peripheral portion 43, which extends in direct contact with the overlying peripheral portion 33 of the inner metal region 32; a respective inner portion 44, which extends in direct contact with the overlying main shield 34, to coat the latter and the parts of the portion of the bottom surface $S_{22b}$ delimited by the bar portions 24A left exposed by the underlying bars 34A of the main shield 34; a respective first intermediate portion 45A and a respective second intermediate portion 45B, which are arranged in a symmetrical manner with respect to the inner portion 44, in such a way that each of the first and the second intermediate portions 45A, 45B is interposed between a respective end of the inner portion 44 and the peripheral portion 43. The first and the second intermediate portions 45A, 45B of the passivation region 42 are arranged below the first and the second intermediate portions 35A, 35B of the inner metal region 32, respectively, to also coat the portions of the bottom surface $S_{22b}$ formed by the first and the second intermediate portions 25A, 25B of the intermediate region 22 and left exposed by the first and the second intermediate portions 35A, 35B of the inner metal region 32. The first intermediate portion 35A of the inner metal region 32 forms the first spring M1 with the first intermediate portion 25A of the intermediate region 22 and the first intermediate portion 45A of the passivation region 42; the second intermediate portion 35B of the inner metal region 32 forms the second spring M2 with the second intermediate portion 25B of the intermediate region 22 and the second intermediate portion 45B of the passivation region 42.

In practice, the inner portion 44 of the passivation region 42 and the suspended region 24 encapsulate the main shield 34. Furthermore, the holes 37 also extend through the inner portion 44 of the passivation region 42.

The sensor 12 further comprises a first bonding region 50, which is formed for example by glassfrit or by an (e.g., gold-tin or aluminum-germanium) alloy and extends below the peripheral portion 43 of the passivation region 42, being in direct contact therewith. Furthermore, the first bonding region 50 laterally delimits a cavity 51, hereinafter referred to as the second actuation half-cavity 51; the second actuation half-cavity 51 extends below the inner portion 44 and the first and the second intermediate portions 45A, 45B of the passivation region 42.

In practice, the suspended region 24, the main shield 34 and the inner portion 44 of the passivation region 42 form a suspended movable structure 55, which is interposed between the first and the second actuation half-cavities 21, 51, which are put in fluidic communication with each other by the holes 37, which face at the bottom the second actuation half-cavity 51, in such a way that the first and the second actuation half-cavities 21, 51 form a main cavity 61; the suspended movable structure 55 is held in suspension by the first and the second springs M1, M2, inside the main cavity 61. Furthermore, without any loss of generality, the suspended movable structure 55 has a periodic shape along the X-axis, that is each section in parallel with the XZ-plane and passing through the bars 34A has a periodic shape in parallel with the X-axis; in other words, in each of these sections, both the main shield 34, the bar portions 24A and the inner portion 44 of the passivation region 42 have a periodic shape.

As shown in FIG. 3, the sensor 12 further comprises a plurality of movable actuation elements 63 and a plurality of fixed actuation elements 65, which are formed by the same material as the intermediate region 22 (e.g., polysilicon), being coplanar therewith, have elongated shapes in parallel with the Y-axis and are interdigitated to each other.

In particular, the fixed actuation elements 65 extend cantilevered in the direction of the suspended region 24, from the peripheral portion 23 of the intermediate region 22, forming a single piece therewith. In greater detail, the peripheral portion 23 of the intermediate region 22 has a hollow shape, which surrounds the suspended region 24 and the first and the second intermediate portions 25A, 25B of the intermediate region 22. Each fixed actuation element 65 has a respective first end, which is fixed to the peripheral portion 23 of the intermediate region 22, and a respective second end, which extends towards the suspended region 24, without contacting the latter. Without any loss of generality, the fixed actuation elements 65 are divided into two groups, which are arranged in a symmetrical manner with respect to the suspended movable structure 55.

The movable actuation elements 63 extend cantilevered in the direction of the peripheral portion 23 of the intermediate region 22, from the suspended region 24, forming a single piece therewith. In greater detail, each movable actuation element 63 has a respective first end, which is fixed to the suspended region 24, and a respective second end, which extends towards the peripheral portion 23 of the intermediate region 22. In particular, the movable actuation elements 63 are divided into two groups, which are arranged in a symmetrical manner with respect to the suspended movable structure 55; the movable actuation elements 63 of the first group are interdigitated with the first group of fixed actuation elements 65, while the movable actuation elements 63 of the second group are interdigitated with the second group of fixed actuation elements 65.

Again without any loss of generality, the sensor 12 further comprises, for each movable actuation element 63, a corresponding movable conductive region 67, which has an elongated shape in parallel with the Y-axis, is arranged below the movable actuation element 63 and forms a single piece with the main shield 34. Similarly, the sensor 12 further comprises, for each fixed actuation element 65, a corresponding fixed conductive region 69, which has an elongated shape in parallel with the Y-axis and is arranged below the fixed actuation element 65. The movable 67 and fixed conductive regions 69 may be formed, for example, by the same material that forms the inner metal region 32. Furthermore, although not shown, the movable 67 and fixed conductive regions 69 may be coated at the bottom by corresponding protective regions formed by the same material that forms the passivation region 42.

Although not shown, the sensor 12 further comprises terminals which allow the movable conductive regions 67 and the fixed conductive regions 69 to be biased with variable voltages, which act as facing plates of a variable capacitor, to apply an electrostatic force that moves the suspended movable structure 55 in parallel with the X-axis; this movement is allowed by the fact that the first and the second springs M1, M2 are yielding along the X-axis. The movement of the suspended movable structure 55 entails the movement, in parallel with the X-axis, of the main shield 34.

In greater detail, the movable conductive regions 67 and the fixed conductive regions 69 may be biased, for example, through conductive paths that include so-called through silicon vias (TSV) and traverse the first outer body 14, the dielectric region 20 and the intermediate region 22. Furthermore, the movable conductive regions 67 and the fixed conductive regions 69 are electrically separated; to this end, although not shown, at least part of the peripheral portion 23 of the intermediate region 22 may have a reduced doping (e.g., may be of intrinsic type); additionally or alternatively, dielectric separating regions (not shown), arranged to electrically separate the fixed conductive regions 69 from the peripheral portion 33 of the inner metal region 32, which is in electrical contact with the movable conductive regions 67, may extend through the peripheral portion 23 of the intermediate region 22.

The sensor 12 further comprises a second bonding region 64, which is formed for example by glassfrit or by an (e.g., gold-tin or aluminum-germanium) alloy and is interposed between the bottom surface $S_{18b}$ of the intermediate body 18 and the top surface $S_{16t}$ of the second outer body 16, being in direct contact therewith.

The intermediate body 18 and the second bonding region 64 are traversed by a further cavity 71, hereinafter referred to as the detection cavity 71. In particular, the detection cavity 71 extends between the top surface $S_{18t}$ of the intermediate body 18 and the top surface $S_{16t}$ of the second outer body 16.

The sensor 12 further comprises a detection structure 80, which is interposed between the second actuation half-cavity 51 and the detection cavity 71.

Without any loss of generality, in the embodiment illustrated in FIG. 2, the detection structure 80 comprises a bearing structure 90, which is suspended above the detection cavity 71, therefore extends between the detection cavity 71 and the second actuation half-cavity 51, below the suspended movable structure 55. Furthermore, the sensor 12 comprises a peripheral structure 92, which is interposed between the intermediate body 18 and the first bonding region 50; in particular, the peripheral structure 92 surrounds the bearing structure 90.

In greater detail, the bearing structure 90 is constrained (e.g., fixed) laterally to the peripheral structure 92. As a first approximation, the bearing structure 90 and the peripheral structure 92 are coplanar.

Without any loss of generality, each of the bearing structure 90 and the peripheral structure 92 may be formed, for example, by one or more dielectric layers, having conductive or semiconductive regions (not shown) also possibly extending therein.

In addition, the sensor 12 comprises a number of detection devices 94 (qualitatively shown in FIG. 2), which are integrated in the bearing structure 90. For example, and without any loss of generality, the sensor 12 may comprise an array of detection devices 94, which therefore have a planar arrangement and are photodetectors capable of varying corresponding electrical quantities according to the radiation impinged thereon.

Always by way of example, each detection device 94 is formed, for example, by a device chosen from among: a corresponding thermocouple; a corresponding thermopile (i.e., a plurality of thermocouples connected in series or in parallel); a corresponding TMOS sensor, i.e., a sensor of CMOS-SOI type; a corresponding bolometer. Each detection device 94 therefore comprises a respective active area, which is sensitive to the impinged radiation.

The arrangement of the detection devices 94 with respect to the bearing structure 90 is such that the following occurs.

As visible in FIG. 2, when the sensor 12 operates in a first operating mode, the detection devices 94 are laterally offset with respect to the main shield 34, that is as a first approximation are arranged in such a way that the respective active areas are vertically aligned to corresponding holes 37. In practice, in the first operating mode, the active areas of the detection devices 94 are laterally offset with respect to the bars 34A of the main shield 34; in other words, the projections along a Z-axis (perpendicular with respect to the X- and Y-axes) of the bars 34A do not intercept the active areas of the detection devices 94.

For example, the first operating mode of the sensor 12 may correspond to the case in which the movable conductive regions 67 and the fixed conductive regions 69 are free of bias, in such a way that the suspended movable structure 55 is in rest position.

Figure 4:
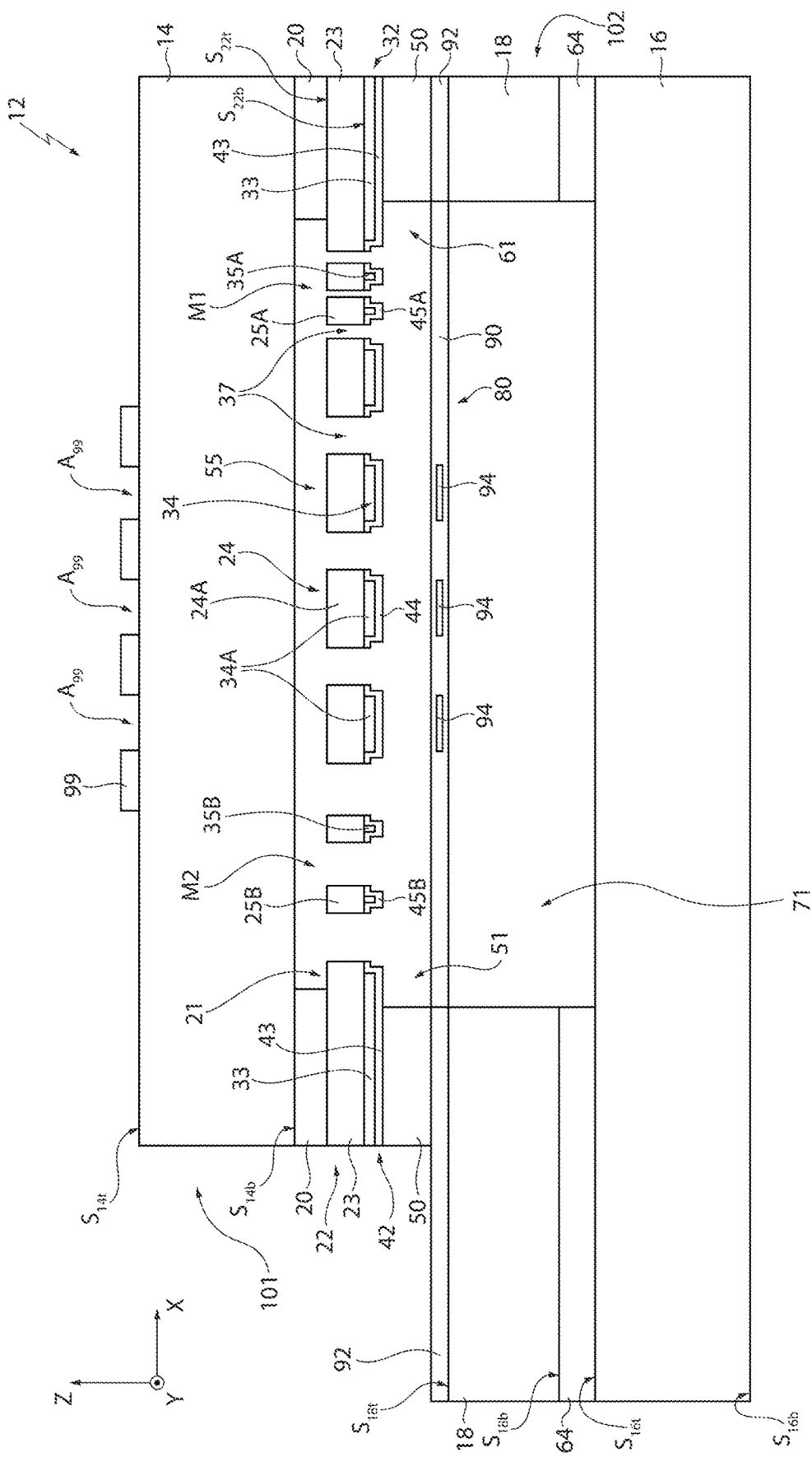

The movable conductive regions 67 and the fixed conductive regions 69 may also be biased in such a way that the sensor 12 operates in a second operating condition, shown in FIG. 4, wherein, with respect to the rest position, the suspended movable structure 55 is translated along the X-axis, in such a way that, as a first approximation, the active areas of the detection devices 94 are vertically aligned to corresponding bars 34A of the main shield 34, which act as electromagnetic shields. In particular, and without any loss of generality, assuming that vertically (i.e., in parallel with the Z-axis) directed radiation impinges on the sensor 12, the bars 34A of the main shield 34 may entirely shield the corresponding detection devices 94; in other words, the projection along the Z-axis of each bar 34A entirely covers the active area of the corresponding detection device 94.

In use, the possibility of switching between the first and the second operating modes causes the sensor 12 to implement a chopper functionality; this chopper is represented by the suspended movable structure 55 and is therefore integrated with the detection devices 94, allowing to avoid having to resort to an outer chopper during the characterization procedure of the sensor 12.

Figure 17:
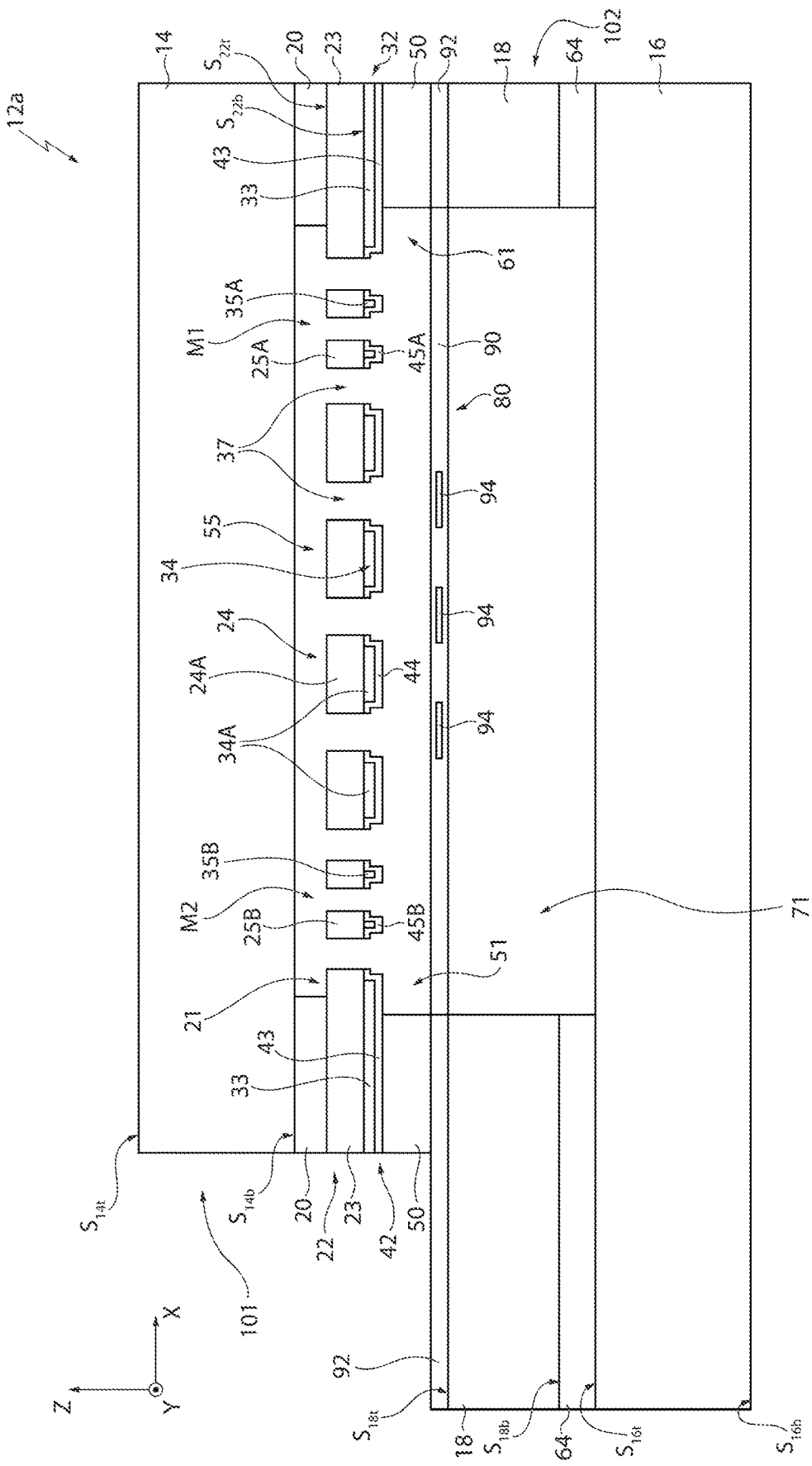
FIG. 17 a cross-section of a radiation sensor in accordance with another embodiment.

The sensor 12 further comprises a further shield 99, hereinafter referred to as the secondary shield 99. However, in general, in the embodiment shown in FIG. 2, the secondary shield 99 is optional. FIG. 17 shows a sensor 12a that is structurally and functionally identically to the sensor 12 of FIG. 2, except that the sensor 12a of FIG. 17 does not include the secondary shield 99. In detail, the secondary shield 99 is formed by metal material (e.g., aluminum or gold or platinum) and extends above the top surface $S_{14t}$ of the first outer body 14. Furthermore, the secondary shield 99 is formed by a single piece and is holed, that is includes a plurality of openings $A_{99}$, through which the radiation may pass; although not shown, the secondary shield 99 may have, for example, a grating shape.

Without any loss of generality, in the embodiment shown in FIG. 2, the secondary shield 99 is laterally offset with respect to the detection devices 94, that is the projection along the Z-axis of the secondary shield 99 falls outside the active areas of the detection devices 94; correspondingly, the projections along the Z-axis of the openings $A_{99}$ fall on corresponding detection devices 94. Furthermore, when the sensor 12 operates in the first operating mode, the secondary shield 99 overlies, from a distance, the main shield 34; in particular, without any loss of generality, the projection along the Z-axis of the secondary screen 99 falls on the main shield 34.

In practice, the presence of the secondary shield 99 does not modify the behavior of the sensor 12 as regards the radiation having a normal impingement, with respect to what has been described hereinabove. However, the shape and the arrangement of the secondary shield 99 may be chosen according to a different impingement angle of the radiation, for example in order to optimize the shielding of the active areas of the detection devices 94 during the second operating mode, that is integrating the shielding offered by the main shield 34.

In general, the movable conductive regions 67 and the fixed conductive regions 69 may be biased in such a way that the sensor 12 operates in an intermediate operating mode between the first and the second operating modes, that is so that the suspended movable structure 55 assumes an intermediate position between the rest position and the position assumed when the sensor 12 operates in the second operating mode; in this case, the active areas of the detection devices 94 may be partially shielded from the projections along the Z-axis of the bars 34A of the main shield 34. In practice, the extent of the shielding, by the main shield 34, of the active areas of the detection devices 94 may be modulated in a gradual manner.

Variations are also possible wherein shapes and/or arrangements of the detection devices 94, of the main shield 34 and of the secondary shield 99, are different from what has been described. For example, referring to the case of radiation with normal impingement, the main shield 34 may shield part of the detection devices 94 also in the first operating mode, that is the projection of the main shield 34 along the Z-axis may fall partially into the active areas of the detection devices 94. Referring again to the case of normal impingement, it is also possible that, in the second operating mode, the main shield 34 only partially shields the detection devices 94.

Always by way of example, embodiments are also possible wherein the projection of the secondary shield 99 along the Z-axis falls partially into the active areas of the detection devices 94. More generally, embodiments are possible wherein, even for radiation with normal impingement, the shielding of the detection devices 94 depends on the mutual positioning of the suspended movable structure 55 with respect to the secondary shield 99; in this case, the maximum shielding may be obtained for a certain position of the suspended movable structure 55, comprised between the positions assumed in the first and the second operating conditions.

For practical purposes, shieldings of desired extent may be obtained for the detection devices 94, against radiation coming from a given impingement angle and for different positions assumed by the suspended movable structure 55, through a suitable choice of the shapes and arrangements of the main shield 34 and of the secondary shield 99.

In order to facilitate the placement of electrical contacts (not shown) for providing the outside world with the electrical signals generated by the detection devices 94, a portion of the peripheral structure 92 laterally offset with respect to the main cavity 61 and to the underlying detection cavity 71 is left exposed, that is, is not covered by the first bonding region 50. In practice, indicating the set formed by the first outer body 14, by the dielectric region 20, by the intermediate region 22, by the inner metal region 32 and by the passivation region 42 as chopper assembly 101, the following occurs.

The chopper assembly 101 has an extension along the X-axis which is smaller with respect to the extension of the second outer body 16 and of the intermediate body 18, which together with the second bonding region 64, the detection structure 80 and the peripheral structure 92, form a detection assembly 102. Furthermore, as a first approximation (i.e., neglecting the possible movements along the X-axis), the suspended movable structure 55 is vertically aligned with the underlying detection structure 80. More precisely, the suspended movable structure 55 may assume at least one position wherein the projection along the Z-axis of at least one part of the main shield 34 falls into the active area of a detection device 94, shielding it from radiation with normal impingement.

Figure 5:
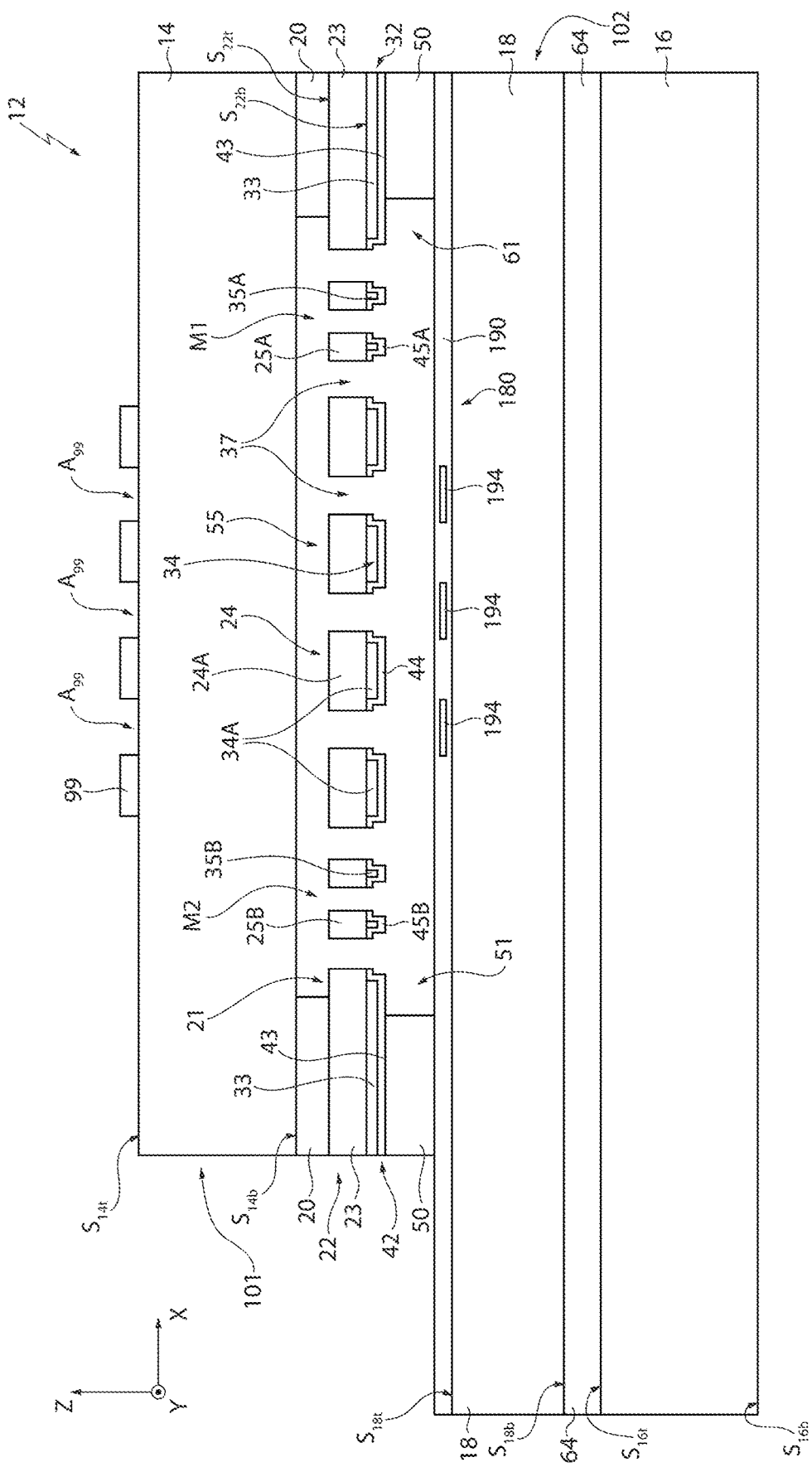
FIGS. 5, 6 and 8 schematically show cross-sections of radiation sensors.

As shown in FIG. 5, embodiments are also possible wherein the detection cavity 71 is absent, in which case the bearing structure (here indicated by 190) of the detection structure (here indicated by 180) is arranged on the intermediate body 18, being integrated therewith. Although not shown in detail, in this case the detection devices, here indicated by 194, may be of CMOS type; therefore, the detection structure 180 may form, for example, a charge-coupling device (CCD). In general, what has been said hereinabove with reference to the movement of the suspended movable structure 55, to the optional presence of the secondary shield 99 and to the shielding of the detection devices 194 in the first and the second operating modes is also applicable to the embodiment shown in FIG. 5.

Still with reference to the embodiments shown in FIGS. 2 and 5, in general the second outer body 16 may be absent; furthermore, the detection cavity 71 may not be entirely closed at the top by the detection structure, which may thus have openings (not shown) which put the detection cavity 71 in communication with the second actuation half-cavity 51. In case these openings are present, the possible presence of the second outer body 16 allows however the detection cavity 71 to be closed at the bottom, in such a way that the cavity formed as a whole by the detection cavity 71 and by the main cavity 61 is hermetically closed, with advantages in terms of detection sensitivity. In this regard, the fact that at least the main cavity 61, having the suspended movable structure 55 moving therein, is hermetically closed and under vacuum means that the movement of the suspended movable structure 55 is not hindered by the friction with the air.

Figure 6:
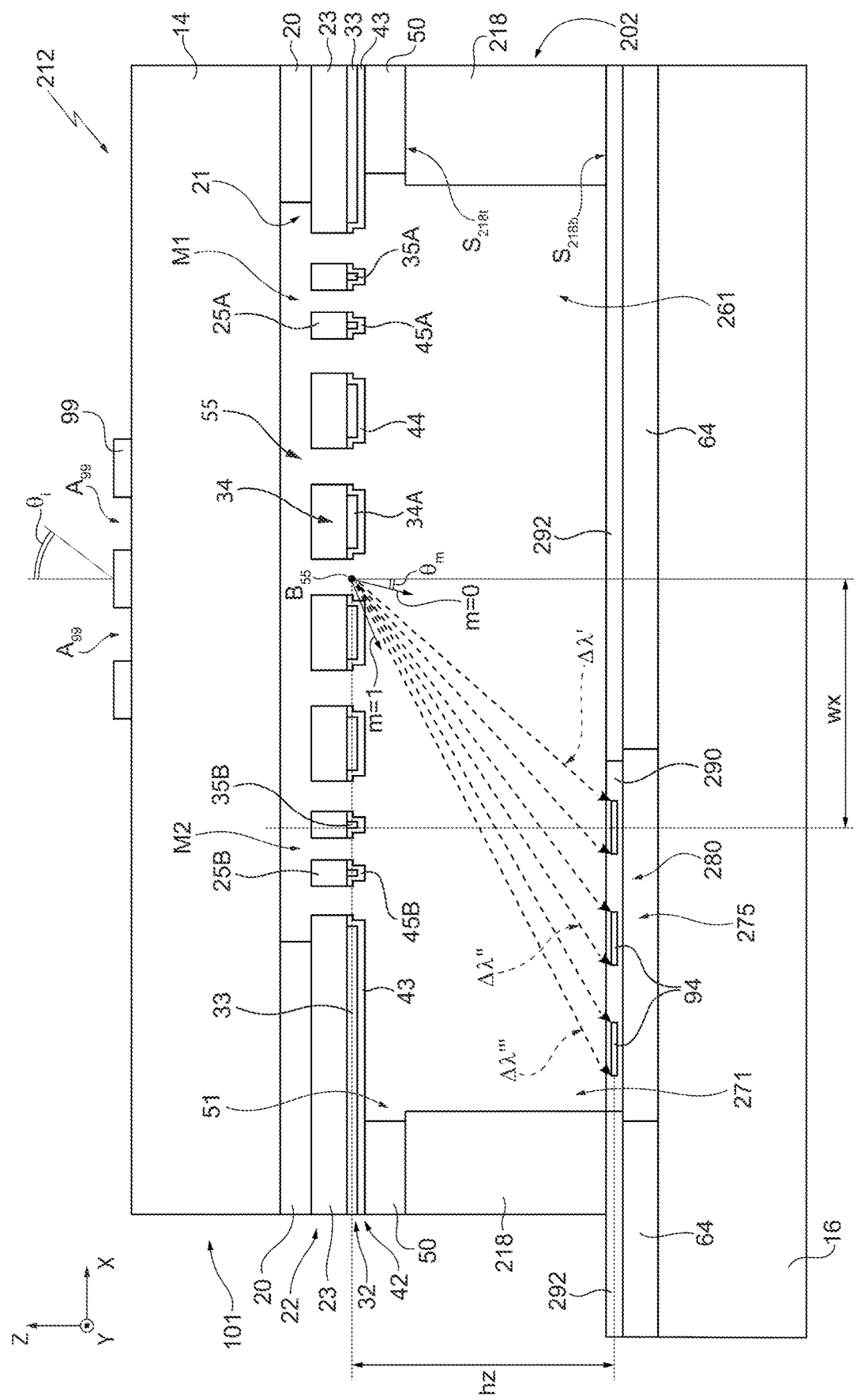

FIG. 6 shows a further embodiment, which is now described limitedly to the differences with respect to FIG. 2; reference numbers already used in FIG. 2 are maintained, unless otherwise specified.

This having been said, the sensor, here indicated by 212, still includes the chopper assembly 101 and the detection assembly, here indicated by 202, as well as the secondary shield 99. Furthermore, as hereinafter explained in greater detail, the suspended movable structure 55 acts as a diffraction grating.

The detection unit 202 still comprises the intermediate body, here indicated by 218, whose top surface $S_{218t}$ is glued to the first bonding region 50. Furthermore, the peripheral structure (indicated by 292) and the detection structure (indicated by 280) extend below the bottom surface $S_{218b}$ of the intermediate body 218.

The detection structure 280 extends below the detection cavity, here indicated by 271. In particular, the detection cavity 271 still extends through the intermediate body 218 and is open at the top, to communicate with the overlying second actuation half-cavity 51. In practice, the main cavity, here indicated by 261, comprises, in addition to the first and the second actuation half-cavities 21, 51, also the underlying detection cavity 271 and is closed at the bottom by the detection structure 280.

The peripheral structure 292, which surrounds the detection structure 280, is bonded to the underlying second bonding region 64, having the second outer body 16 therebelow. The second bonding region 64 laterally delimits an additional cavity 275, which is closed at the top by the detection structure 280 and is closed at the bottom by the second outer body 16. In practice, the detection structure 280 is interposed between the main cavity 261 and the additional cavity 275. Although not shown, the detection structure 280 may include openings such that the main cavity 261 and the additional cavity 275 are in fluidic communication with each other.

In greater detail, the detection structure 280 is laterally offset with respect to the overlying suspended movable structure 55. For example, without any loss of generality, in FIG. 6 the detection structure 280 is laterally offset to the left (with reference to the orientation of FIG. 6) with respect to the suspended movable structure 55. Furthermore, indicating with hz the distance, measured along the Z-axis, between the suspended movable structure 55 and the detection structure 280 (in particular, the distance between the planes parallel with the XY-plane wherein the barycenter $B_{55}$ of the suspended movable structure 55, qualitatively shown in FIG. 6, and the detection devices 94 lie, respectively), this distance is increased, with the same sensor size, with respect to what occurs in the embodiment shown in FIG. 2, because the detection structure 280 extends below the intermediate body 218. The advantages associated with this feature are explained hereinafter.

In detail, in the embodiment shown in FIG. 6, the suspended movable structure 55 performs in space a chromatic scattering of the radiation impinged thereon. Furthermore, the main shield 34 continues to act as a chopper. In this manner, the sensor 212 has the following optical behavior.

In detail, the sensor 212 may be sized to act as a spectrometer. In fact, indicating with wx the offset, measured along the X-axis, of a generic detection device 94 with respect to the barycenter $B_{55}$ of the suspended movable structure 55, and assuming that the radiation impinges on the suspended movable structure 55 at a given angle, this offset wx may be sized so that the detection device 94 receives radiation with a wavelength that falls into a corresponding wavelength range.

Figure 7:
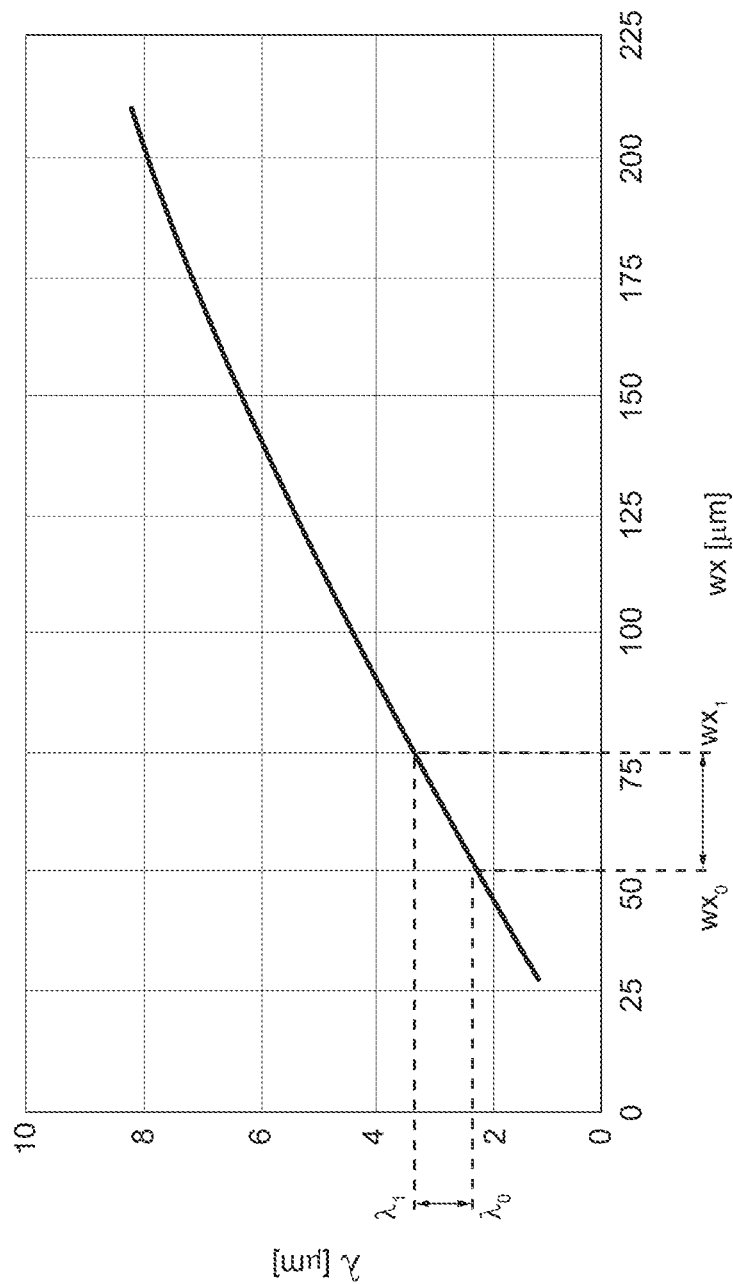
FIG. 7 shows the trend of the wavelength of the radiation impinged on a detection device, as the position of the detection device varies along an axis.

In greater detail, the sizing may be performed observing that, indicating with A, $\vartheta_i$ and $\vartheta_m$ the spatial periodicity along X of the suspended movable structure 55, the angle with which the radiation impinges on the first outer body 14 (and on the secondary shield 99), and therefore also on the suspended movable structure 55, and the exit angle of the radiation from the suspended movable structure 55, respectively, it is:

$$A*[\sin(\vartheta_m)-\sin(\vartheta_i)]=m*\lambda;$$

$$wx=hz*tg(\vartheta_m)$$

wherein $\lambda$ indicates the wavelength of the radiation, while m=0, 1, 2 . . . indicates the so-called diffraction order. Consequently, once the distance hz and the spatial periodicity A have been fixed, and considering for example the diffraction order m=1, the wavelength $\lambda$ of the radiation impinged on a detection device 94 varies according to the distance wx, as shown for example in FIG. 7, where it is assumed, for example, A=14 μm, hz=300 μm and $\vartheta i=0°$. Consequently, assuming that a generic detection device 94 extends in a range [$wx_0$-$wx_1$], it will receive radiation with a wavelength comprised in the range [$\lambda_0$-$\lambda_1$], that is radiation with a wavelength that falls into a corresponding bandwidth. In this regard, in FIG. 6 three different wavelength ranges are indicated $\Delta\lambda'$, $\Delta\lambda'''$, $\Delta\lambda'''$, relating to the radiations that fall into three different detection devices 94.

With regard to the detection devices 94, they may be of the same type described with reference to FIG. 2.

Without prejudice to what has been previously described regarding the chromatic scattering operated by the suspended movable structure 55, the intensity of the radiation impinged on the detection devices 94 may be modulated through the controlled movement of the suspended movable structure 55 and the resulting variation of the position of the main shield 34 with respect to the secondary shield 99, as a first approximation without altering the corresponding wavelength bandwidths. In other words, the wavelength bandwidth associated with each detection device 94 does not vary as the position along the X-axis of the suspended movable structure 55 varies. In fact, as a first approximation, the variable alignment between the main shield 34 and the secondary shield 99 allows modulating the intensity of the radiation exiting the suspended movable structure 55 (and therefore modulating the transmissivity of the set formed by the main shield 34 and the secondary shield 99) and therefore affects the intensity of the radiation impinged on the detection devices 94, but not on the wavelength. Still in other words, the variable alignment between the main shield 34 and the secondary shield 99 influences the extent of the shielding (attenuation) that the radiation impinged on the secondary shield 99 has undergone, intended as a reduction in intensity between the radiation impinged on the secondary shield 99 and the overall radiation that propagates downstream of the suspended movable structure 55.

In general, the Applicant has noted that also in the embodiment shown in FIG. 2 the suspended movable structure 55 may behave like a diffraction grating, but the close position, with respect to the same suspended movable structure 55, of the detection devices 94 means that there is not enough space to chromatically separate the radiation, before it impinges on the detection devices 94.

Figure 8:
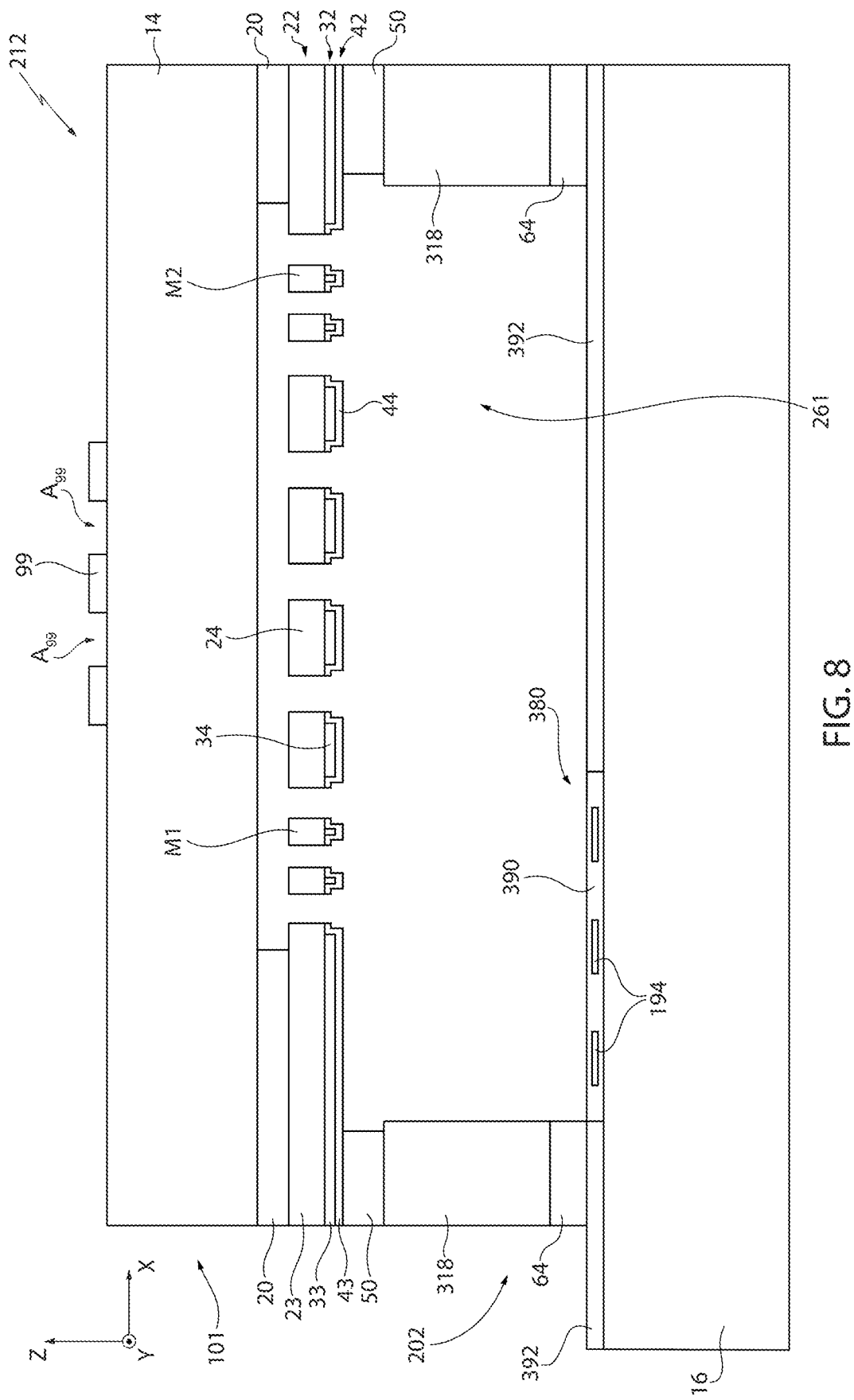

As shown in FIG. 8, embodiments are also possible wherein the detection structure (indicated by 380) and the peripheral structure (indicated by 392) are integrated on the second outer body 16. In this case, the additional cavity 275 is absent, and the bearing structure (indicated by 390) and the peripheral structure 392 extend in contact with the underlying second outer body 16. Furthermore, the second bonding region 64 is interposed between the intermediate body, here indicated by 318, and the peripheral structure 392. The detection devices, here indicated by 194, may be of the same type described with reference to FIG. 5. Also in this case, the detection structure 380 may act as a spectrometer.

Figure 9:
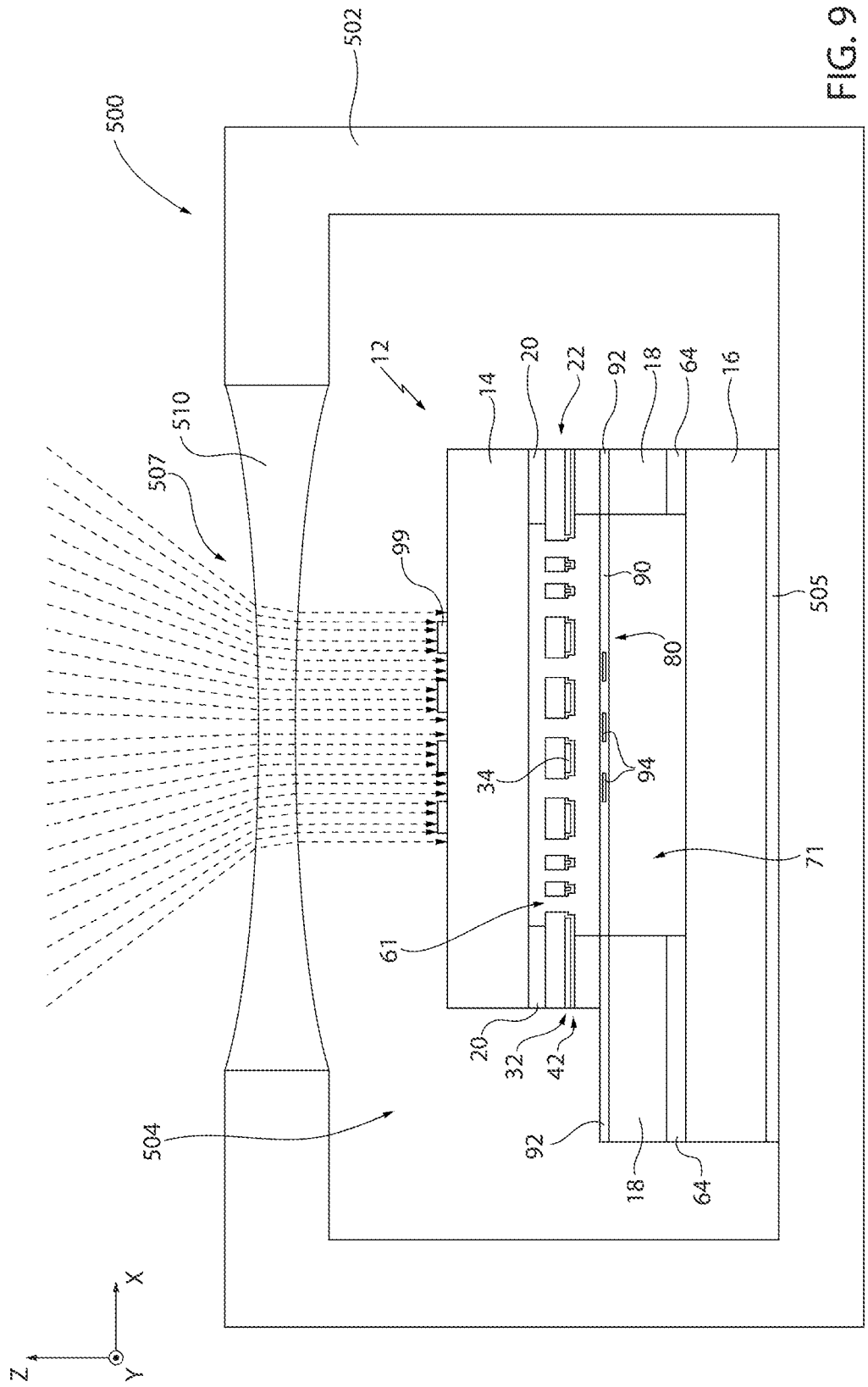
FIG. 9 schematically shows a cross-section of a package containing a sensor.

As shown in FIG. 9, the present sensor may be packaged in a package 500, which comprises a packaging structure 502, which delimits an accommodation cavity 504, having the sensor (for example, FIG. 9 refers, without any loss of generality, to the sensor 12 shown in FIG. 2) arranged therein. The packaging structure 502 is opaque for the radiation (i.e., does not allow radiation to pass into the accommodation cavity 504) and is formed, for example, by FR4 or an organic material or steel. The sensor 12 is bonded to the packaging structure 502 through a bonding layer 505, which is interposed between the second outer body 16 and the packaging structure 502.

The packaging structure 502 delimits an opening 507, which is closed by a lens 510, which overlies, from a distance, the secondary shield 99 (optional) of the sensor 12. The lens 510 is transparent to the radiation and is for directing the radiation coming from the outside world on the sensor 12, and in particular on the detection structure 80, after passing through the main shield 34 which acts as a chopper. The presence of the lens 510 allows the numerical aperture of the sensor 12 to be increased. For example, the lens 510 is of biconcave type. The lens 510 also performs the function of focusing the optical beams on the suspended movable structure 55.

Regardless of the embodiment, the chopper assembly 101 may be manufactured in the following manner.

Figure 10:
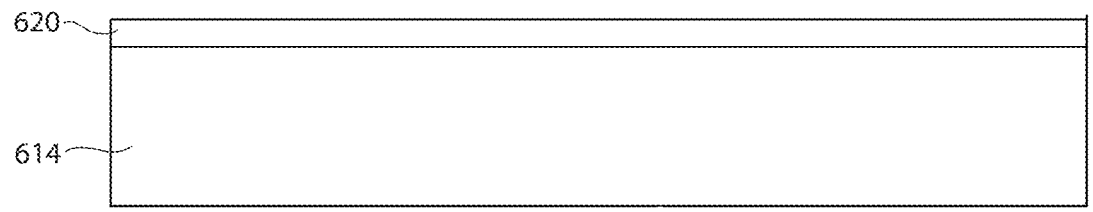
FIGS. 10-16 schematically show cross-sections of a sensor, during subsequent steps of a manufacturing process.

Initially, as shown in FIG. 10, an oxide layer 620 is formed above a semiconductor wafer 614. The oxide layer 620 and the semiconductor wafer 614 are intended to form the dielectric region 20 and the first outer body 14, respectively.

Figure 11:
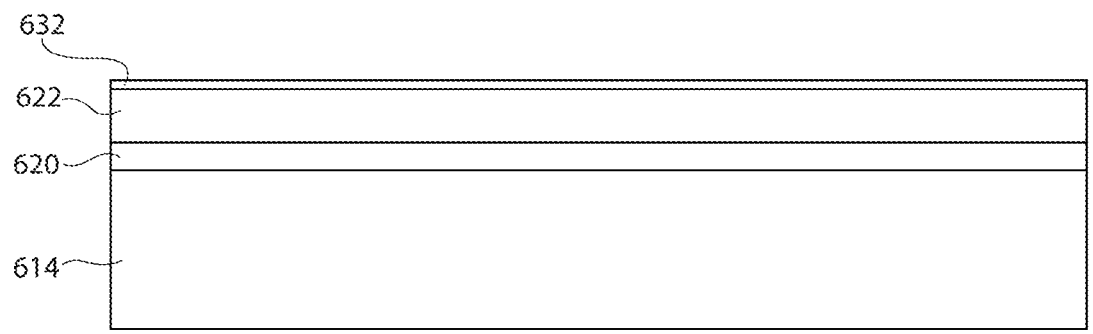

Subsequently, as shown in FIG. 11, a polysilicon layer 622, intended to form the intermediate region 22, is formed above the oxide layer 620; furthermore, a first conductive layer 632 is formed above the polysilicon layer 622.

Figure 12:
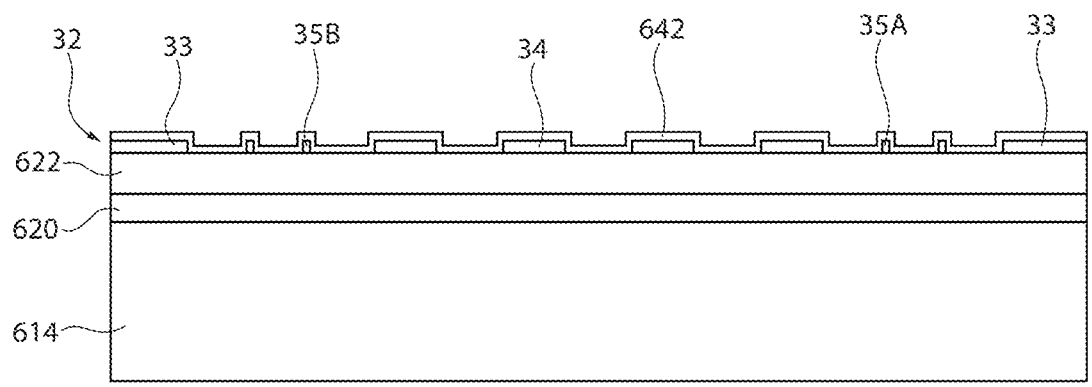

Then, as shown in FIG. 12, an etching is performed, to selectively remove portions of the first conductive layer 632 and expose first portions of the polysilicon layer 622. The remaining portions of the first conductive layer 632 form the inner metal region 32, and in particular form the peripheral portion 33, the first and the second intermediate portions 35A, 35B of the inner metal region 32 and the main shield 34. Furthermore, a passivation layer 642, intended to form the passivation region 42, is formed on the inner metal region 32 and on the first exposed portions of the polysilicon layer 622.

Figure 13:
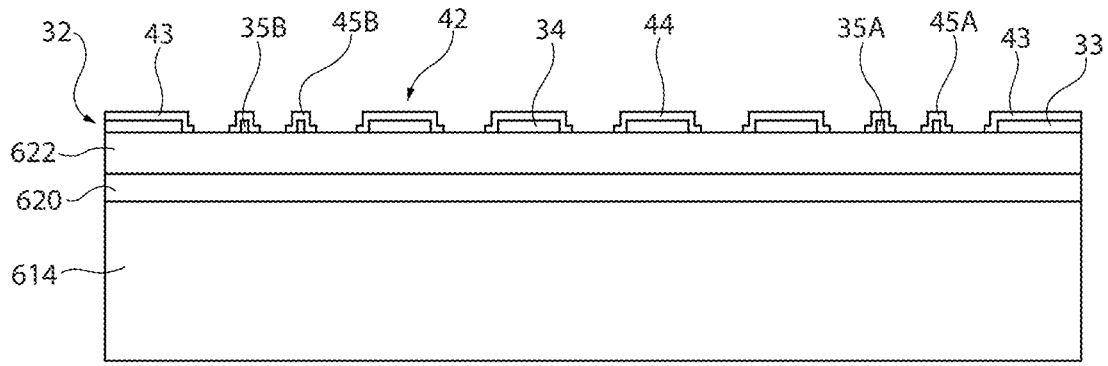

Subsequently, as shown in FIG. 13, portions of the passivation layer 642 arranged in contact with the underlying polysilicon layer 622 are selectively removed, in such a way to expose second portions of the polysilicon layer 622. The remaining part of passivation layer 642 forms the passivation region 42.

Figure 14:
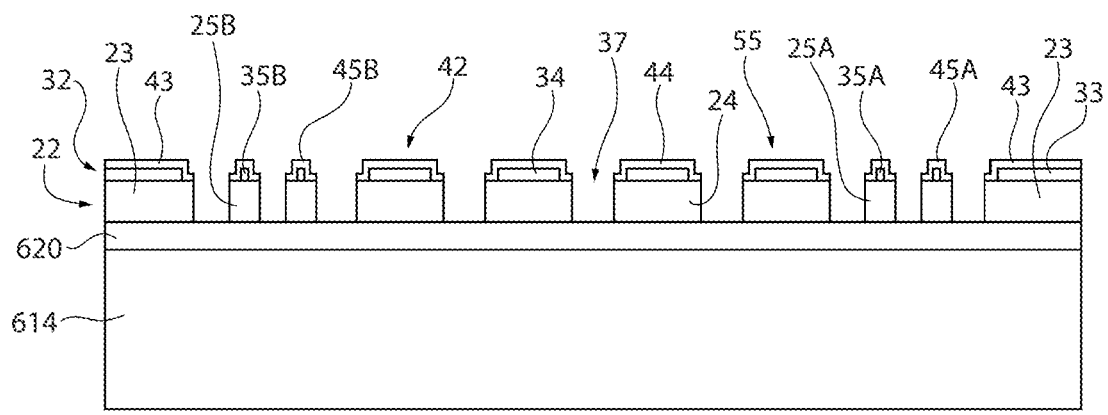

Then, as shown in FIG. 14, an etching is performed, using the passivation region 42 as a mask, in order to selectively remove the aforementioned second portions of the polysilicon layer 622, to expose underlying portions of the oxide layer 620. In practice, the holes 37, which are temporarily closed at the bottom by the underlying oxide layer 620, are formed; furthermore, the remaining portion of the polysilicon layer 622 forms the intermediate region 22. In this manner, the suspended movable structure 55 is formed.

Figure 15:
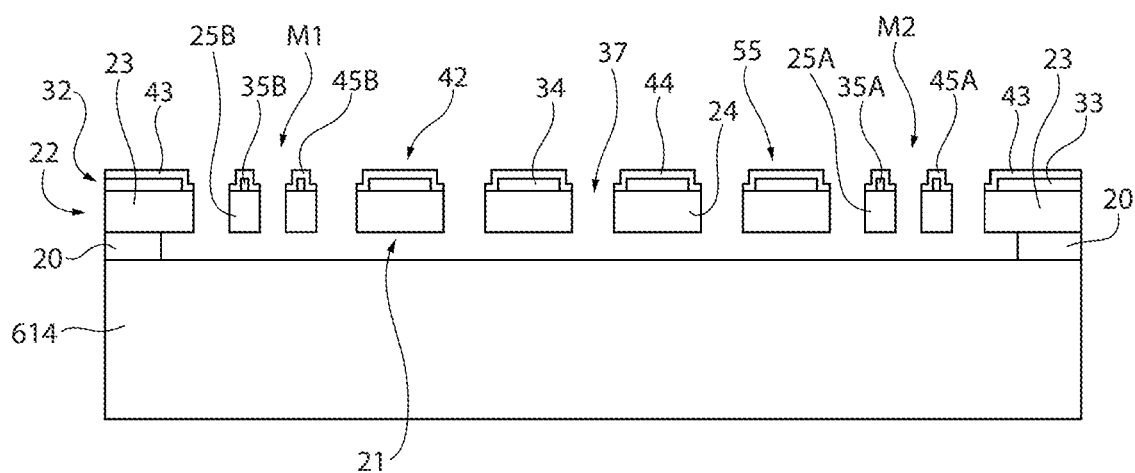

Subsequently, as shown in FIG. 15, the portion of the oxide layer 620 arranged below the first and the second intermediate portions 25A, 25B of the intermediate region 22 and of the suspended region 24 is selectively removed, to form the first actuation half-cavity 21 and release the suspended movable structure 55 and the first and the second springs M1, M2. The remaining portion of the oxide layer 620 forms the dielectric region 20. In this manner, the chopper assembly 101 is formed, except for the secondary shield 99 (optional).

In greater detail, an etching through hydrogen fluoride (HF) is performed, from the exposed portions of the oxide layer 620, in order to release the suspended movable structure 55.

Figure 16:
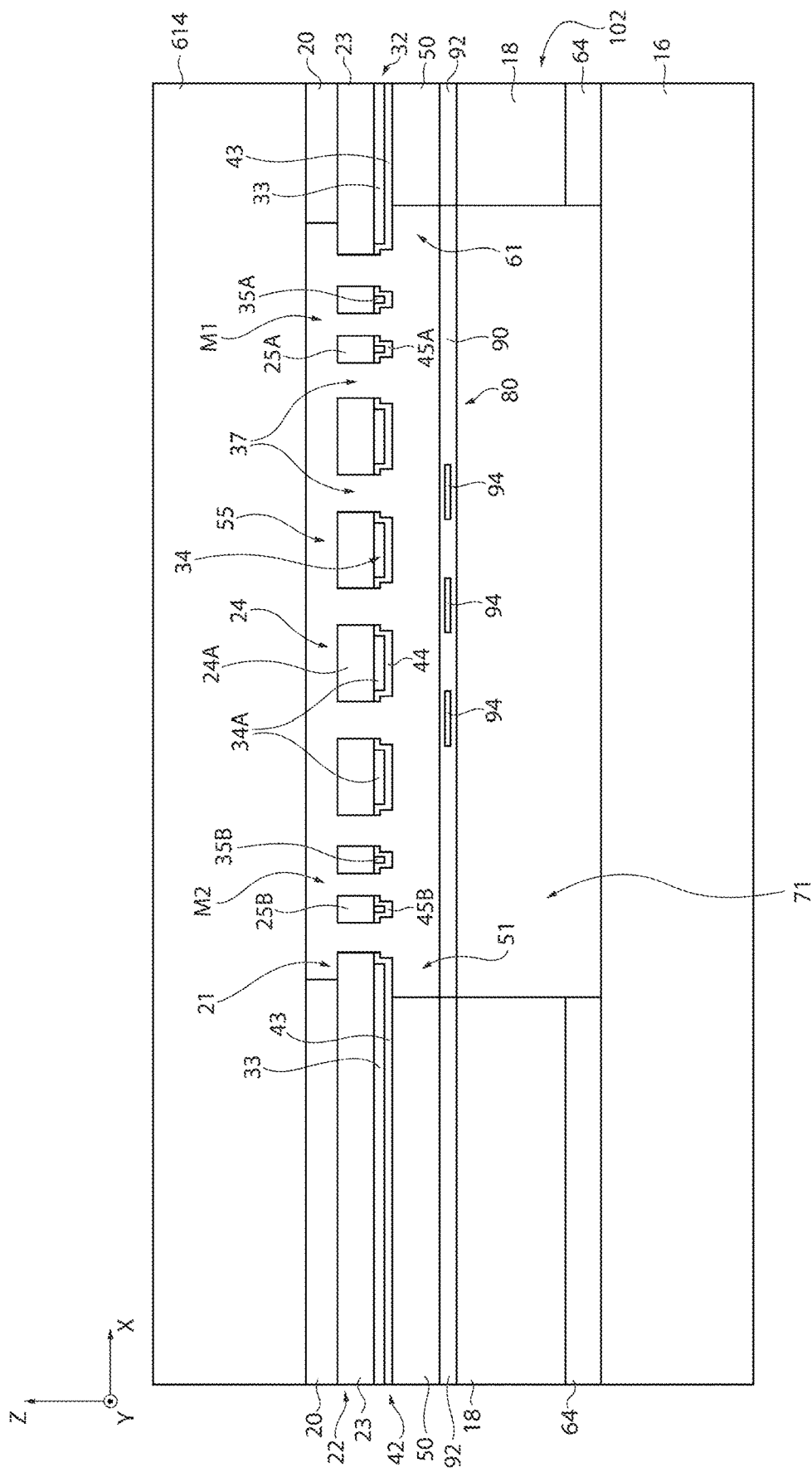

Then, as shown in FIG. 16, the chopper assembly 101 is flipped over and bonded to the detection assembly 102, which has been previously formed in a per se known manner and therefore not shown. Following this operation, the chopper assembly 101 entirely overlies the peripheral structure 92. In order to facilitate the formation of the electrical contacts (not shown) for providing the outside world with the electrical signals generated by the detection devices 94, a portion of the peripheral structure 92 laterally offset with respect to the main cavity 61 is subsequently exposed, by performing a cutting operation (not shown) of a portion of the chopper assembly 101 laterally offset with respect to the main cavity 61; the remaining portion of the semiconductive wafer 614 forms the first outer body 14. Although not shown, the secondary shield 99, if any, may be formed prior to performing the aforementioned cutting operation of a portion of the chopper assembly 101 laterally offset with respect to the main cavity 61.

The advantages that the present sensor allows to obtain are clear from the previous description. In particular, the present sensor allows a chopper to be integrated in an optoelectronic device. Some embodiments also allow a diffraction grating and a chopper to be integrated, in a same optoelectronic device, in order to form, for example, a spectrometer with an integrated chopper.

Finally, it is clear that, as previously mentioned, modifications and variations may be made to what has been described and illustrated herein, without departing from the scope of protection of the present disclosure.

For example, the main shield 34 may have a shape different from what has been described.

The secondary shield 99 may be replaced by a plurality of physically disjoint shielding portions (not shown), in such a way that the set of these shielding portions has an optical behavior that is in any case partially transmissive towards the radiation which impinges thereon.

The inner metal region 32 may be formed by a multilayer structure, for example of titanium and titanium nitride.

The first and the second outer bodies and the intermediate body may be formed by materials different from what has been described. For example, according to the wavelength of use, embodiments are possible wherein the first outer body 14 is formed by a material transparent to the radiation in the so-called near-infrared (for example, a glass).

A radiation sensor may be summarized as including a detection assembly (102; 202) and a chopper assembly (101), which are mechanically coupled to delimit a main cavity, (61; 216); and wherein the chopper assembly (101) includes: a suspended movable structure (55), which extends in the main cavity (61; 261); and an actuation structure (63, 65), which is electrically controllable to cause a change of position of the suspended movable structure, (55); and wherein the detection assembly (102; 202) includes a detection structure (80; 180; 280; 380), which faces the main cavity (61; 261) and includes a number of detection devices, (94; 194); and wherein the suspended movable structure (55) includes a first shield (34) of conductive material, which is configured to shield the detection devices (94) from the radiation, the shielding of the detection devices (94) being a function of the position of the suspended movable structure (55).

The chopper assembly (101) may include a respective fixed body (14) and a deformable structure (M1, M2), the suspended movable structure (55) being coupled to the fixed body (14) of the chopper assembly (101) through interposition of the deformable structure, (M1, M2); and the actuation structure (63, 65) may be electrically controllable to cause a movement of the suspended movable structure (55) with respect to the fixed body (14) of the chopper assembly (101) and a resulting deformation of the deformable structure (M1, M2).

The detection devices (94) may have a planar arrangement; and the actuation structure (63, 65) may be configured to move the suspended movable structure (55) in parallel with said planar arrangement.

The detection assembly (102) may include a main semiconductor body (18), which laterally delimits an additional cavity (71), and an outer body (16), which may be fixed to the main semiconductor body, (18); and the detection structure (80) may be fixed to the main semiconductor body (18) and is suspended on the additional cavity (71), said additional cavity (71) being closed at the bottom by the outer body (16).

The detection assembly (102) may include a main semiconductor body, (18); and the detection structure (180) may be integrated on the main semiconductor body (18).

The chopper assembly (101) may further include a partially transmissive second shield (99), which may be fixed on the fixed body (14) of the chopper assembly (101) and has a shape such that said shielding of the detection devices (94) depends on the position of the suspended movable structure (55) with respect to the detection structure (80; 180; 280; 380) and on the position of the suspended movable structure (55) with respect to the second shield (99).

The suspended movable structure (55) may extend below the fixed body (14) of the chopper assembly, (101); and the chopper assembly (101) may further include a second shield (99), which is arranged on top of the fixed body (14) of the chopper assembly (101) and is partially transmissive; and wherein the detection structure (280; 380) may be laterally offset with respect to the suspended movable structure (55), which may be configured in such a way to receive radiation after said radiation has impinged on the second shield (99) and has passed through the second shield (99) and the fixed body (14) of the chopper assembly (101); said suspended movable structure (55) being further configured to chromatically scatter the received radiation, to direct towards each detection device (94) radiation having a wavelength that depends on the lateral offset of the detection device (94) with respect to the suspended movable structure (55); and wherein the first and the second shields (34, 99) may be configured to attenuate the radiation that impinges on the second shield (99) as a function of the position of the suspended movable structure (55) with respect to the second shield (99).

The detection assembly (202) may include a main semiconductor body (218), which laterally delimits a part of the main cavity, (261); and the main cavity (261) may be closed at the bottom by the detection structure (280), which may be bonded under the main semiconductor body (218).

The detection assembly (202) may include a main semiconductor body (16) and a spacer, (318); and wherein the spacer (318) may be interposed between the fixed body (14) of the chopper assembly (101) and the main semiconductor body (16) of the detection assembly (202) and laterally delimits part of the main cavity (261), which may be closed at the bottom by the detection structure (380), which may be integrated on the main semiconductor body (16) of the detection assembly (202).

A device may be summarized as including: a sensor (12; 212) according to any of the preceding claims; and a package (500) including a packaging structure (502), which is optically opaque and delimits an accommodation cavity (504) overlaid by an opening (507); and a lens (510) which closes said opening, (507); wherein the sensor (12; 212) is arranged inside the accommodation cavity (504), below the lens (510), which is configured to focus the radiation on the sensor (12; 212).

A process of manufacturing a radiation sensor (12; 212), may be summarized as including the steps of forming a detection assembly (102; 202) and a chopper assembly (101); and mechanically coupling the detection assembly (102; 202) and the chopper assembly (101) so that the detection assembly (102; 202) and the chopper assembly (101) delimit a main cavity, (61; 216); wherein said step of forming a chopper assembly (101) comprises:

forming a suspended movable structure (55), which extends in the main cavity (61; 261); and forming an actuation structure (63, 65), which is electrically controllable to cause a change of position of the suspended movable structure, (55); wherein the step of forming a detection assembly (102; 202) comprises forming a detection structure (80; 180; 280; 380) including a number of detection devices (94), so that it faces the main cavity (61; 261); and wherein the step of forming a suspended movable structure (55) includes forming a first shield (34) of conductive material, configured to shield the detection devices (94) from the radiation, the shielding of the detection devices (94) being a function of the position of the suspended movable structure (55).

The step of forming a chopper assembly (101) may include: forming a fixed body (14) and a deformable structure, (M1, M2); and the step of forming a suspended movable structure (55) may be such that the suspended movable structure (55) may be coupled to the fixed body (14) of the chopper assembly (101) through interposition of the deformable structure (M1, M2).

The step of forming a chopper assembly (101) may include: on a wafer (614), forming a dielectric layer (620); on the dielectric layer (620), forming an intermediate layer (622) of a material different from the material of the dielectric layer (620); on the intermediate layer (622), forming a conductive layer (632) and subsequently selectively removing portions of the conductive layer (632) to expose first portions of the intermediate layer (622), and in such a way that the remaining portions of the conductive layer (632) form the first shield (34); coating the first shield (34) and said first exposed portions of the intermediate layer (622) with a passivation layer (642); selectively removing portions of the passivation layer (642) arranged on the intermediate layer (622), to expose second portions of the intermediate layer (622); selectively removing said second portions of the intermediate layer (622), to expose underlying portions of the dielectric layer (620); and starting from the exposed portions of the dielectric layer (620), selectively removing a part of the dielectric layer (620) arranged below the first shield (34), to release the suspended movable structure (55).

The dielectric layer (620) may be formed by oxide; and the intermediate layer (622) is of polysilicon.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A radiation sensor comprising:
a first body;
a second body;
a main cavity between the first body and the second body;
a detection cavity between the main cavity and the second body;
a detection assembly and a chopper assembly between the first body and the second body, the detection assembly and the chopper assembly mechanically coupled to delimit the main cavity, wherein the chopper assembly includes:
a suspended movable structure in the main cavity; and
an actuation structure including a first component embedded in the suspended movable structure and configured to be electrically controlled to cause a change of position of the suspended movable structure,
wherein the detection assembly includes:
a member extending across the detection cavity between the detection cavity and the main cavity and facing the main cavity; and
a plurality of detection devices embedded in the member, and
wherein the suspended movable structure comprises a first shield of conductive material, the first shield being configured to shield the plurality of detection devices from radiation, the shielding of the plurality of detection devices being a function of a position of the suspended movable structure.

2. The radiation sensor according to claim 1, wherein the chopper assembly comprises a fixed body and a deformable structure, the suspended movable structure being coupled to the fixed body of the chopper assembly through interposition of the deformable structure, wherein the actuation structure is electrically controllable to cause a movement of the suspended movable structure with respect to the fixed body of the chopper assembly and a resulting deformation of the deformable structure.

3. The radiation sensor according to claim 2, wherein the plurality of detection devices have a planar arrangement; and wherein the actuation structure is configured to move the suspended movable structure in parallel with the planar arrangement.

4. The radiation sensor according to claim 2, wherein the detection assembly comprises a main semiconductor body laterally delimiting the detection cavity, and an outer body fixed to the main semiconductor body, wherein a detection structure is fixed to the main semiconductor body and is suspended at the detection cavity, the detection cavity being closed at the bottom by the outer body.

5. The radiation sensor according to claim 2, wherein the detection assembly comprises a main semiconductor body, and wherein a detection structure is integrated on the main semiconductor body.

6. The radiation sensor according to claim 4, wherein the chopper assembly further comprises a partially transmissive second shield fixed on the fixed body of the chopper assembly and has a shape such that shielding of the plurality of detection devices depends on the position of the suspended movable structure with respect to the detection structure and on the position of the suspended movable structure with respect to the second shield.

7. The radiation sensor according to claim 2, wherein the suspended movable structure extends below the fixed body of the chopper assembly, wherein the chopper assembly comprises a second shield arranged on top of the fixed body of the chopper assembly and is partially transmissive, wherein the detection structure is laterally offset with respect to the suspended movable structure, the suspended movable structure is configured in such a way to receive radiation after radiation has impinged on the second shield and has passed through the second shield and the fixed body of the chopper assembly, the suspended movable structure being configured to chromatically scatter the received radiation to direct towards each detection device radiation having a wavelength that depends on the lateral offset of the detection device with respect to the suspended movable structure; and wherein the first and the second shields are configured to attenuate the radiation that impinges on the second shield as a function of the position of the suspended movable structure with respect to the second shield.

8. The radiation sensor according to claim 7, wherein the detection assembly comprises a main semiconductor body, the main semiconductor body laterally delimits a part of the main cavity, wherein the main cavity is closed at the bottom by the detection structure, the detection structure being bonded under the main semiconductor body.

9. The radiation sensor according to claim 7, wherein the detection assembly comprises a main semiconductor body and a spacer, and wherein the spacer is interposed between the fixed body of the chopper assembly and the main semiconductor body of the detection assembly and laterally delimits part of the main cavity, the main cavity being closed at the bottom by the detection structure, the detection structure is integrated on the main semiconductor body of the detection assembly.

10. A device, comprising:
a radiation sensor comprising:
a first body;
a second body;
a main cavity between the first body and the second body;
a detection assembly coupled to a chopper assembly between the first body and the second body, the detection assembly and the chopper assembly delimiting the main cavity, wherein the chopper assembly comprises:
a suspended movable structure in the main cavity; and
an actuation structure including a first component embedded in the suspended movable structure and configured to be electrically controlled to cause a change of position of the suspended movable structure, wherein the detection assembly comprises a member extending across a detection cavity between the detection cavity and the main cavity and facing the main cavity and including a plurality of detection devices embedded in the member, and wherein the suspended movable structure includes a first shield of conductive material, the first shield being configured to shield the plurality of detection devices from radiation, the shielding of the plurality of detection devices being a function of a position of the suspended movable structure, a package comprising a packaging structure that is optically opaque and delimits an accommodation cavity overlaid by an opening; and a lens covering the opening, wherein the radiation sensor is arranged inside the accommodation cavity, the lens being positioned and configured to focus the radiation to the radiation sensor.

11. The device according to claim 10, wherein the chopper assembly comprises a fixed body and a deformable structure, the suspended movable structure being coupled to the fixed body of the chopper assembly through interposition of the deformable structure.

12. The device according to claim 11, wherein the actuation structure is electrically controllable to cause a movement of the suspended movable structure with respect to the fixed body of the chopper assembly and a resulting deformation of the deformable structure.

13. The device according to claim 12, wherein the chopper assembly further comprises a partially transmissive second shield fixed on the fixed body of the chopper assembly and has a shape such that shielding of the plurality of detection devices depends on the position of the suspended movable structure with respect to a detection structure and on the position of the suspended movable structure with respect to the second shield.

14. The device according to claim 10, wherein the detection assembly comprises a main semiconductor body, the main semiconductor body laterally delimits a part of the main cavity, wherein the main cavity is closed at the bottom by a detection structure, the detection structure being bonded under the main semiconductor body.

15. A process of manufacturing a radiation sensor comprising:

forming a first body and a second body;

forming a main cavity between the first body and the second body;

a detection cavity between the main cavity and the second body;

forming a detection assembly and a chopper assembly between the first body and the second body; and mechanically coupling the detection assembly and the chopper assembly so that the detection assembly and the chopper assembly delimit the main cavity, wherein forming the chopper assembly includes:

forming a suspended movable structure in the main cavity; and forming an actuation structure including a first component embedded in the suspended movable structure and that is electrically controllable to cause a change of position of the suspended movable structure, wherein forming the detection assembly comprises forming a member extending across the detection cavity between the detection cavity and the main cavity and including a plurality of detection devices embedded in the member and facing the main cavity, and wherein forming the suspended movable structure includes forming a first shield of conductive material configured to shield the plurality of detection devices from radiation, the shielding of the plurality of detection devices being a function of the position of the suspended movable structure.

16. The process according to claim 15, wherein forming the chopper assembly comprises:

forming a fixed body and a deformable structure, wherein forming the suspended movable structure is such that the suspended movable structure is coupled to the fixed body of the chopper assembly through interposition of the deformable structure.

17. The process according to claim 16, wherein forming the chopper assembly comprises:

forming a dielectric layer on a wafer;

on the dielectric layer, forming an intermediate layer of a material that is different from a material of the dielectric layer;

on the intermediate layer, forming a conductive layer and selectively removing portions of the conductive layer to expose first portions of the intermediate layer, wherein remaining portions of the conductive layer form the first shield;

coating the first shield and the first exposed portions of the intermediate layer with a passivation layer;

selectively removing portions of the passivation layer arranged on the intermediate layer and exposing second portions of the intermediate layer;

selectively removing the second portions of the intermediate layer and exposing underlying portions of the dielectric layer; and starting from the exposed portions of the dielectric layer, selectively removing a part of the dielectric layer arranged below the first shield and releasing the suspended movable structure.

18. The process according to claim 17, wherein the dielectric layer is formed by oxide, and wherein the intermediate layer is polysilicon.

19. The process according to claim 15, wherein the detection assembly is formed on a main semiconductor body.

20. The process according to claim 19, wherein the main semiconductor body laterally delimits a part of the main cavity, wherein the main cavity is closed at the bottom by a detection structure, the detection structure being bonded under the main semiconductor body.

* * * * *